United States Patent
Chuang et al.

(10) Patent No.: US 8,883,594 B2
(45) Date of Patent: Nov. 11, 2014

(54) VERTICAL TUNNELING FIELD-EFFECT TRANSISTOR CELL AND FABRICATING THE SAME

(71) Applicant: Taiwan Semiconductor Manufacturing Company, Ltd., Hsin-Chu (TW)

(72) Inventors: Harry-Hak-Lay Chuang, Crescent (SG); Cheng-Cheng Kuo, Hsinchu (TW); Ming Zhu, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/286,492

(22) Filed: May 23, 2014

(65) Prior Publication Data
US 2014/0256102 A1 Sep. 11, 2014

Related U.S. Application Data

(62) Division of application No. 13/745,225, filed on Jan. 18, 2013, now Pat. No. 8,754,470.

(51) Int. Cl.
*H01L 21/336* (2006.01)
*H01L 29/417* (2006.01)
*H01L 29/66* (2006.01)

(52) U.S. Cl.
CPC .... *H01L 29/66666* (2013.01); *H01L 29/41783* (2013.01)

USPC ............... 438/268; 438/283; 257/E21.41

(58) Field of Classification Search
CPC ............... H01L 21/823885; H01L 21/823828; H01L 29/772
USPC .................. 438/268, 283; 257/E21.41
See application file for complete search history.

(56) References Cited

U.S. PATENT DOCUMENTS

| | | | |
|---|---|---|---|
| 7,514,324 B2 | 4/2009 | Leslie | |
| 7,999,313 B2 | 8/2011 | Kim | |
| 8,207,032 B2 | 6/2012 | Fischer et al. | |
| 8,476,132 B2 * | 7/2013 | Masuoka et al. | 438/268 |
| 2010/0207202 A1 | 8/2010 | Ueda | |
| 2012/0319201 A1 * | 12/2012 | Sun et al. | 257/338 |
| 2013/0334614 A1 | 12/2013 | Liaw | |
| 2014/0054711 A1 * | 2/2014 | Chuang et al. | 257/368 |
| 2014/0061775 A1 * | 3/2014 | Chuang et al. | 257/329 |

* cited by examiner

*Primary Examiner* — Trung Q Dang
(74) *Attorney, Agent, or Firm* — Haynes and Boone, LLP

(57) ABSTRACT

A method of making a tunneling field-effect transistor (TFET) device is disclosed. A frustoconical protrusion structure is disposed over the substrate and protrudes out of the plane of substrate. Isolation features are formed on the substrate. A drain region is disposed over the substrate adjacent to the frustoconical protrusion structure and extends to a bottom portion of the frustoconical protrusion structure as a raised drain region. A source region is formed as a top portion of the frustoconical protrusion structure. A series connection and a parallel connection are made among TFET devices units.

20 Claims, 15 Drawing Sheets

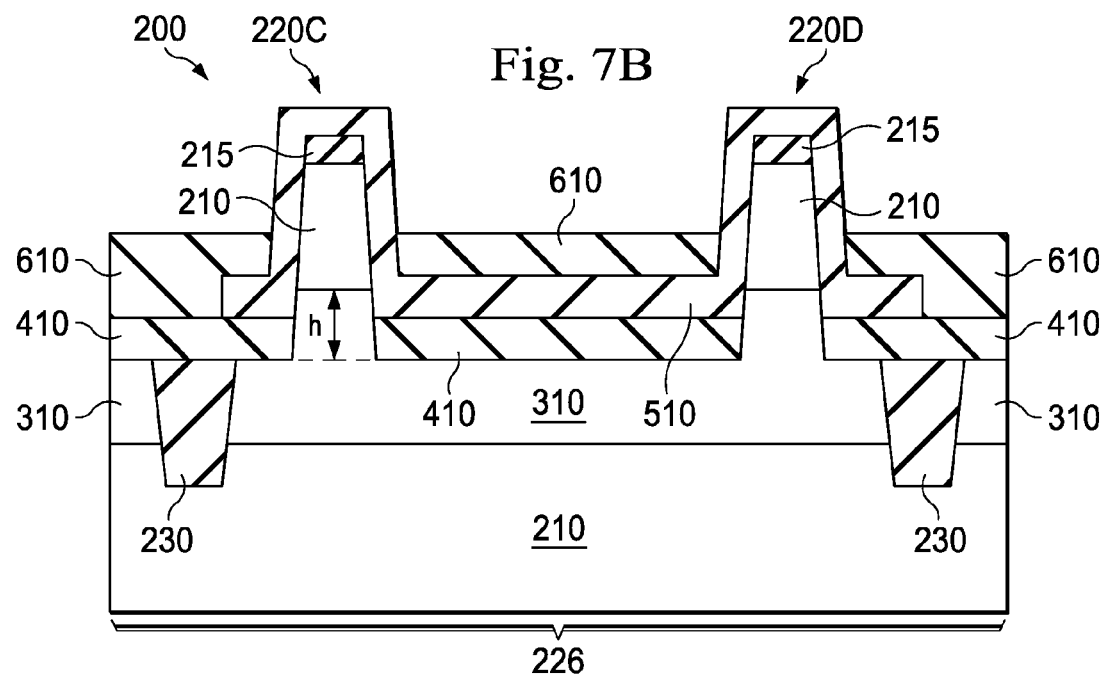
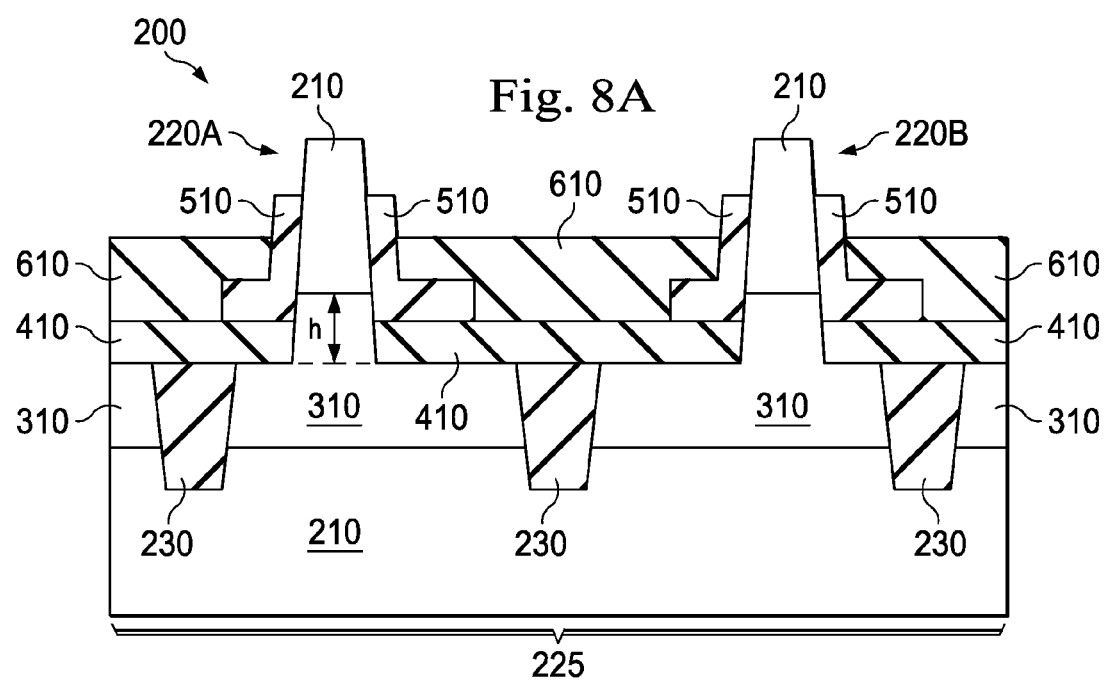

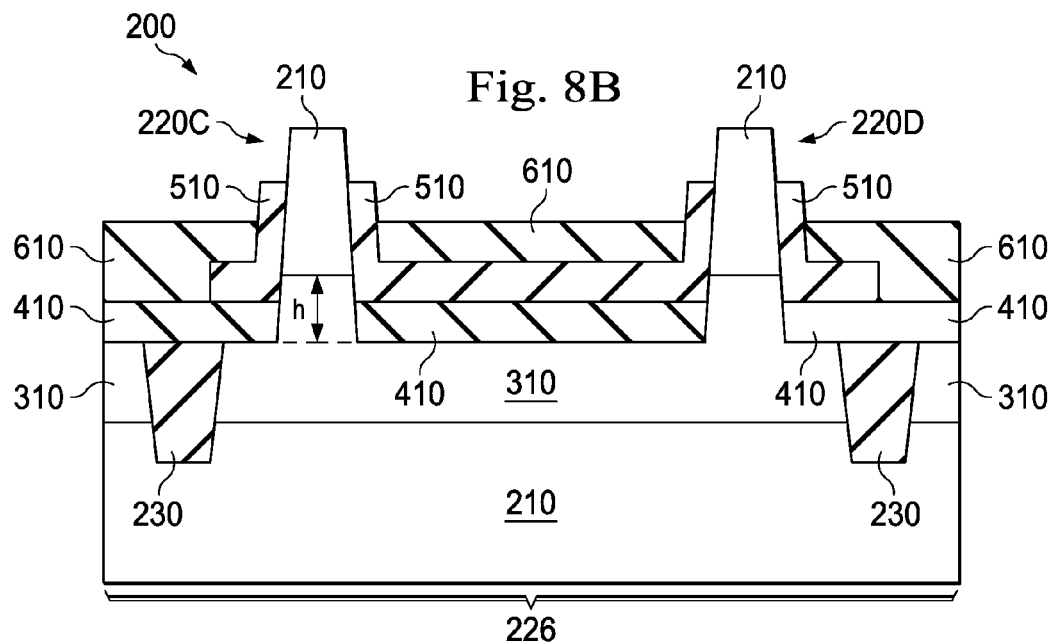
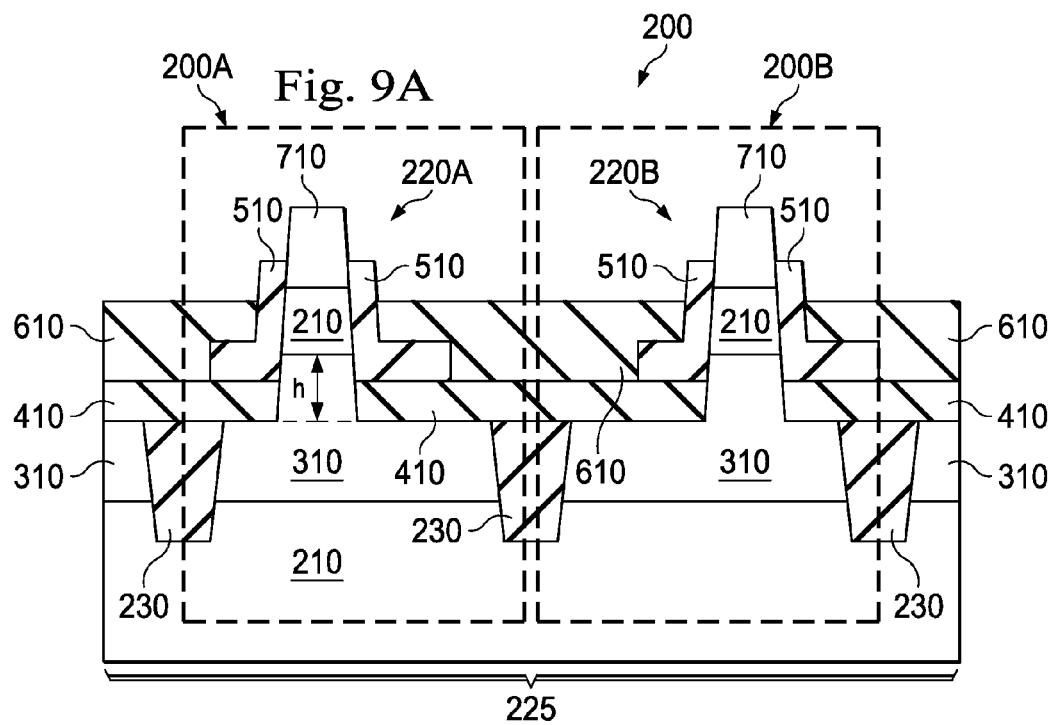

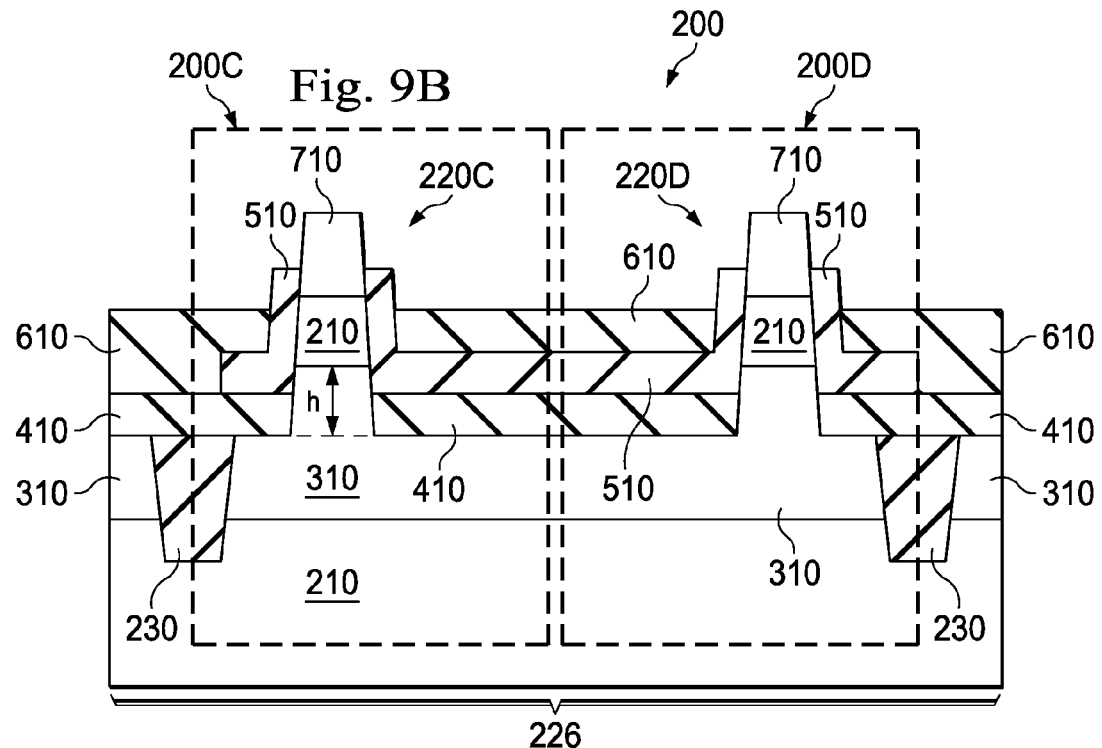
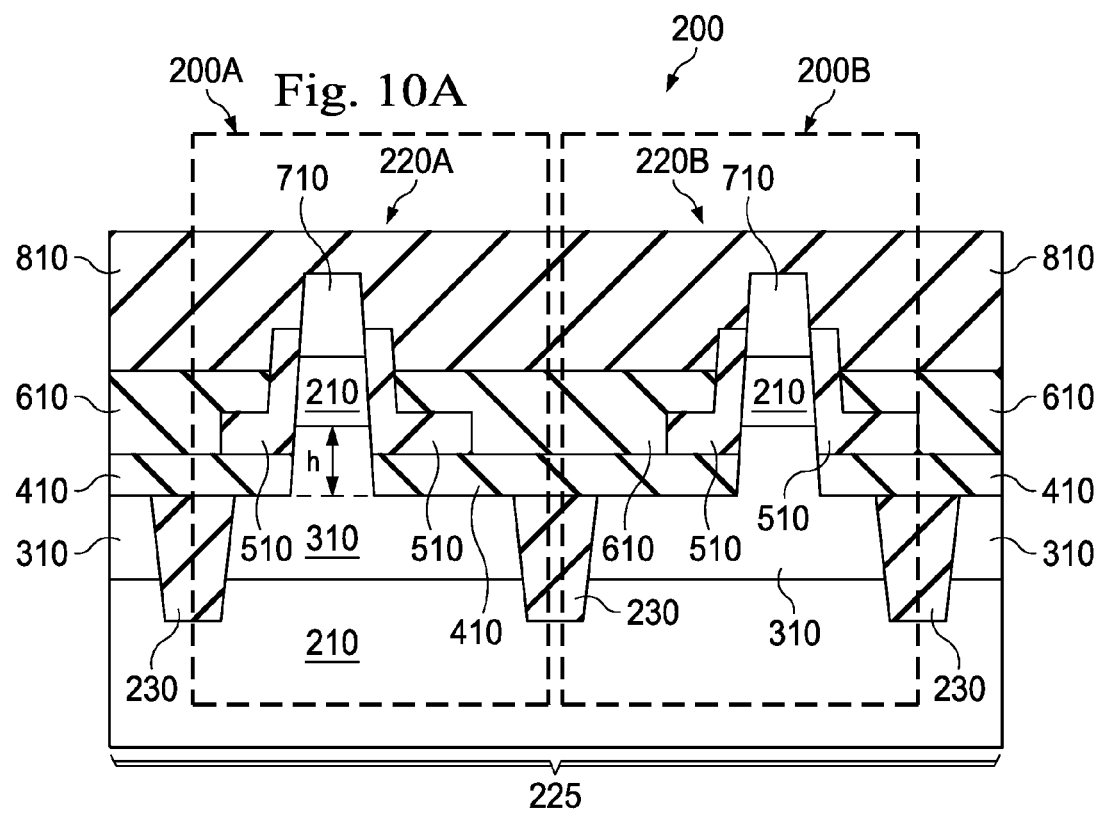

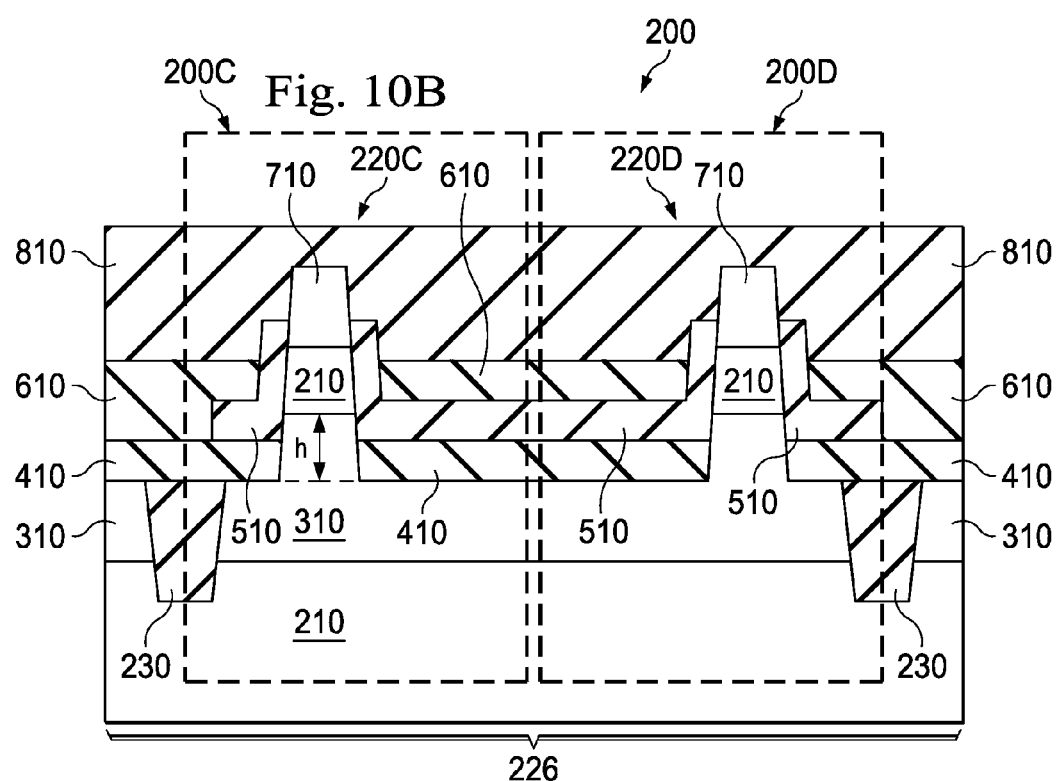

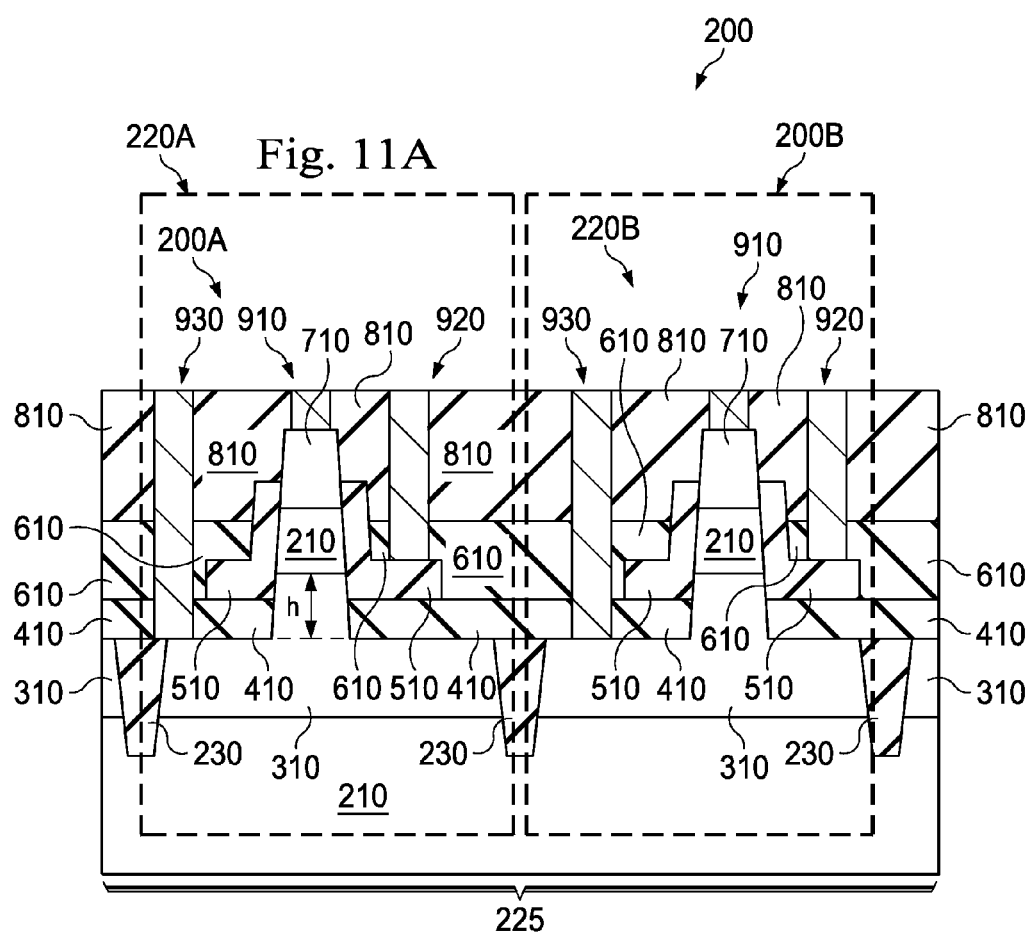

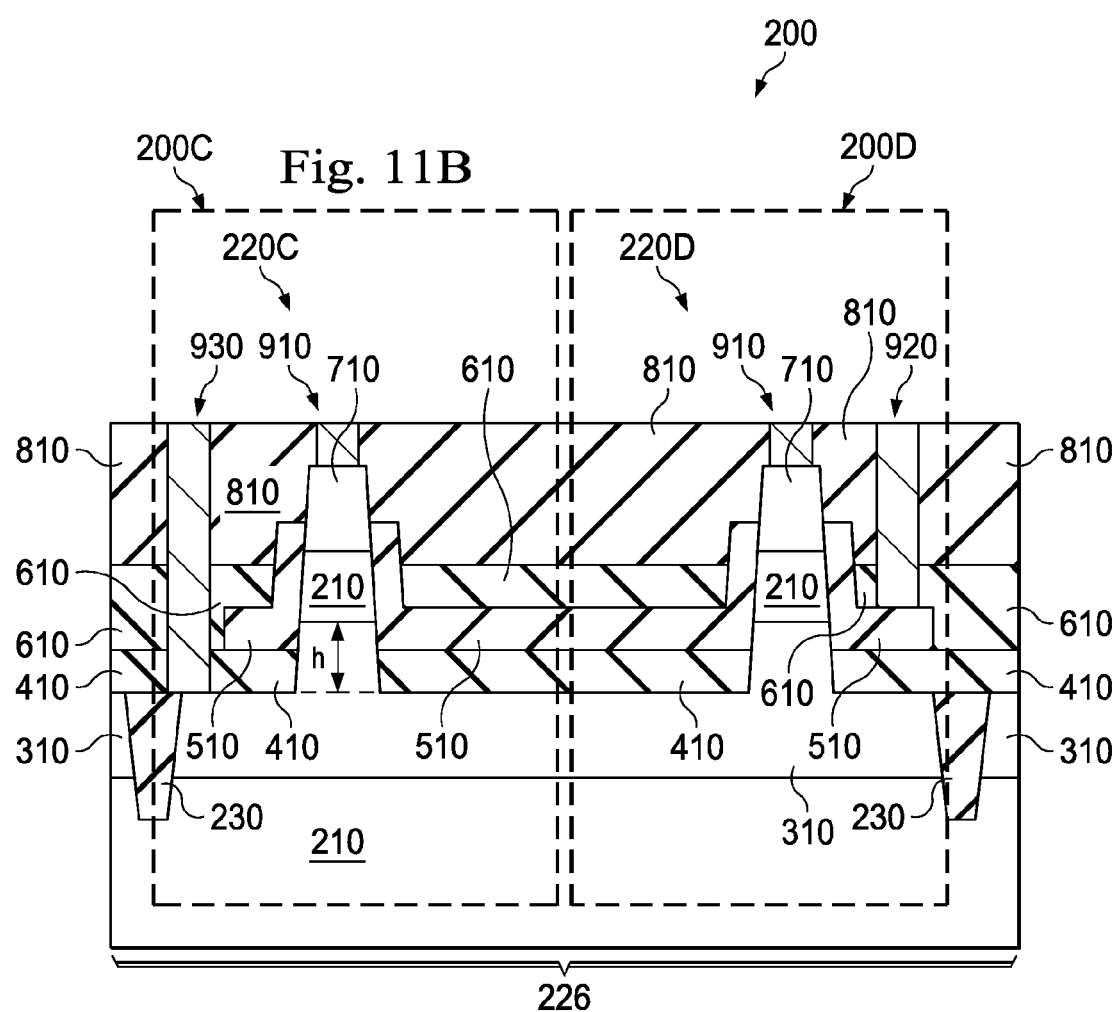

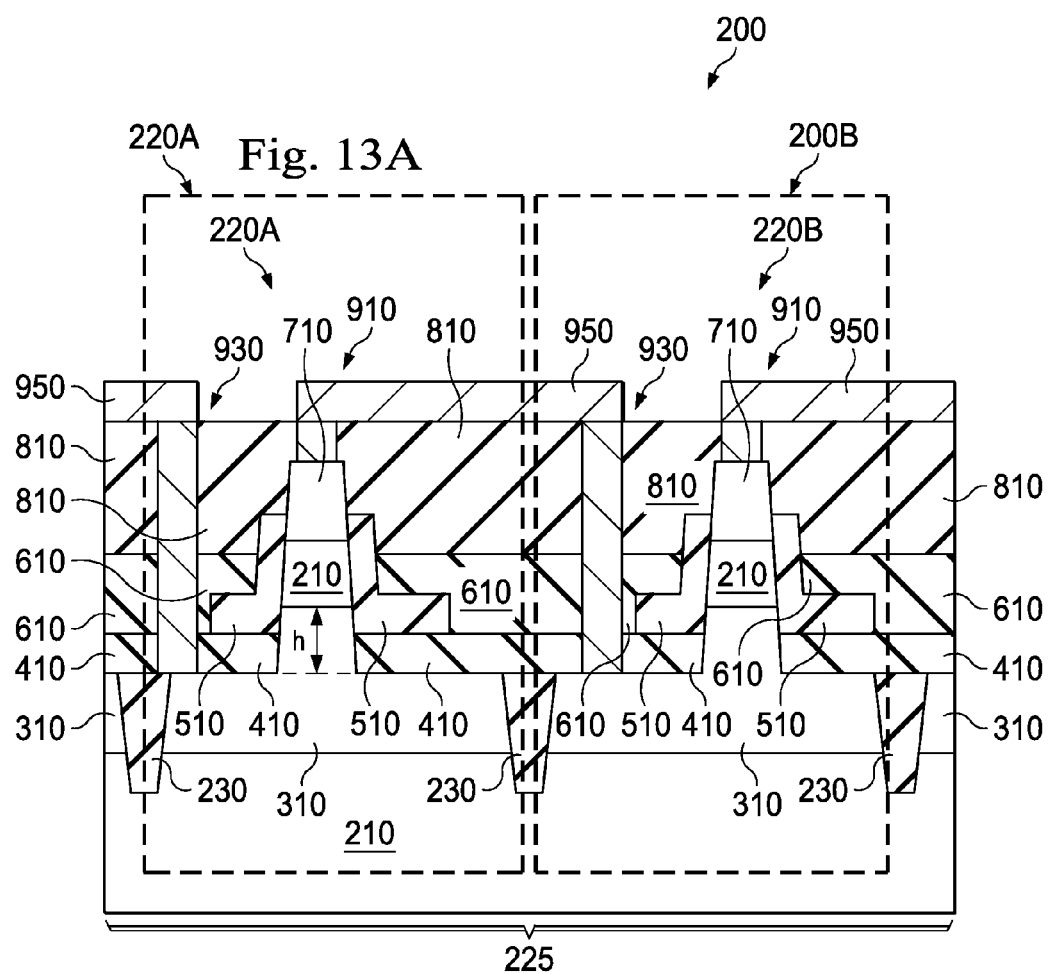

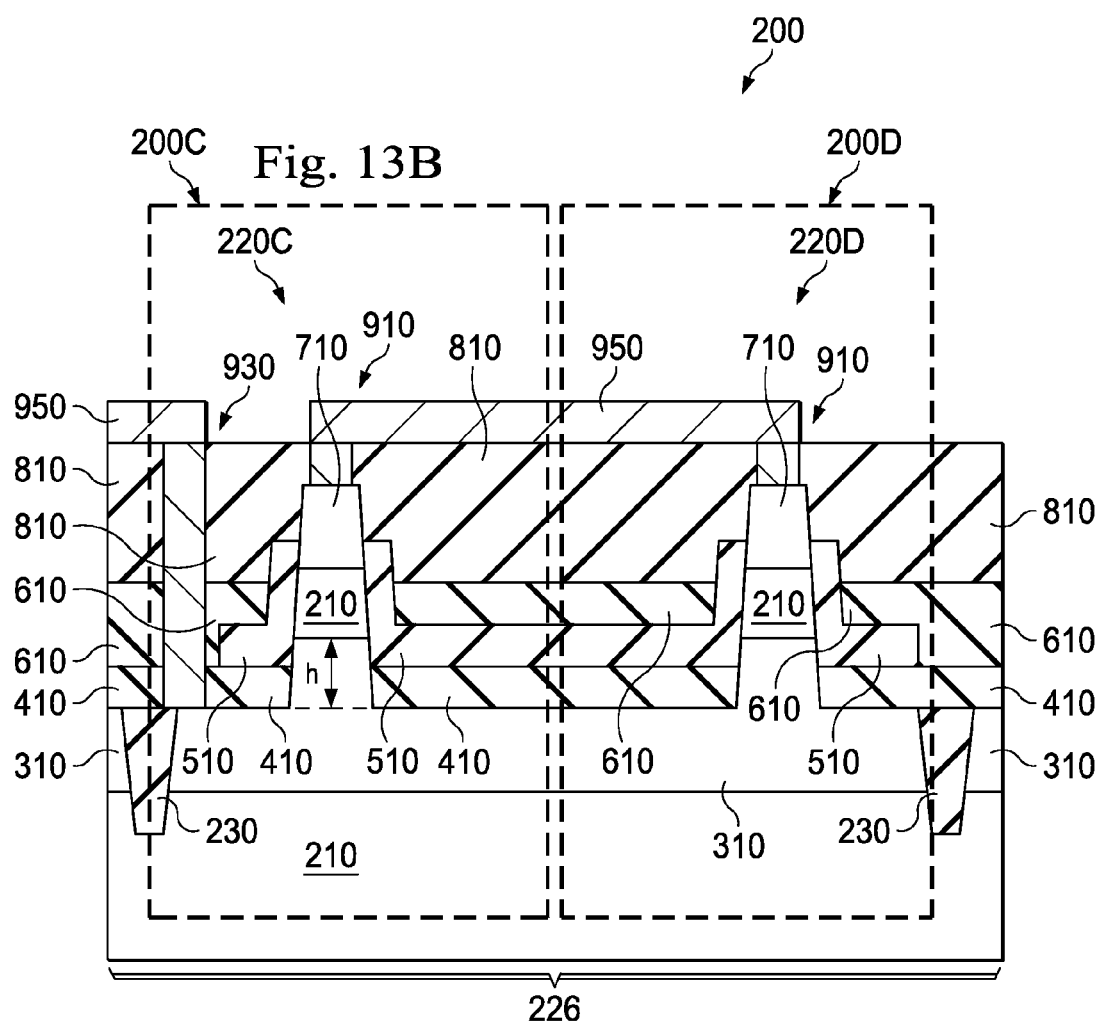

VERTICAL TUNNELING FIELD-EFFECT TRANSISTOR CELL AND FABRICATING THE SAME

This is a divisional of U.S. Ser. No. 13/745,255 filed Jan. 18, 2013, the entire disclosure of which is hereby incorporated by reference.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

However, as the size of the smallest component has decreased, numerous challenges have risen. As features become closer, current leakage can become more noticeable, signals can crossover more easily, and power usage has become a significant concern. The semiconductor integrated circuit industry has produced numerous developments in effort to continue the process of scaling. One of the developments is the potential replacement or supplementation of the conventional MOS field-effect transistor by the tunneling field-effect transistor (TFET).

TFETs are promising devices that may enable further scaling of power supply voltage without substantially increasing off-state leakage currents due to its sub-60 mV/dec sub-threshold swing. However, existing TFETs have not been satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-11B are cross-sectional views of an example semiconductor device at fabrication stages constructed according to the method of FIG. 1.

FIGS. 13A and 13B are cross-sectional views of an example semiconductor device at fabrication stages constructed according to the method of FIG. 1 and with the contact layout of FIG. 12.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
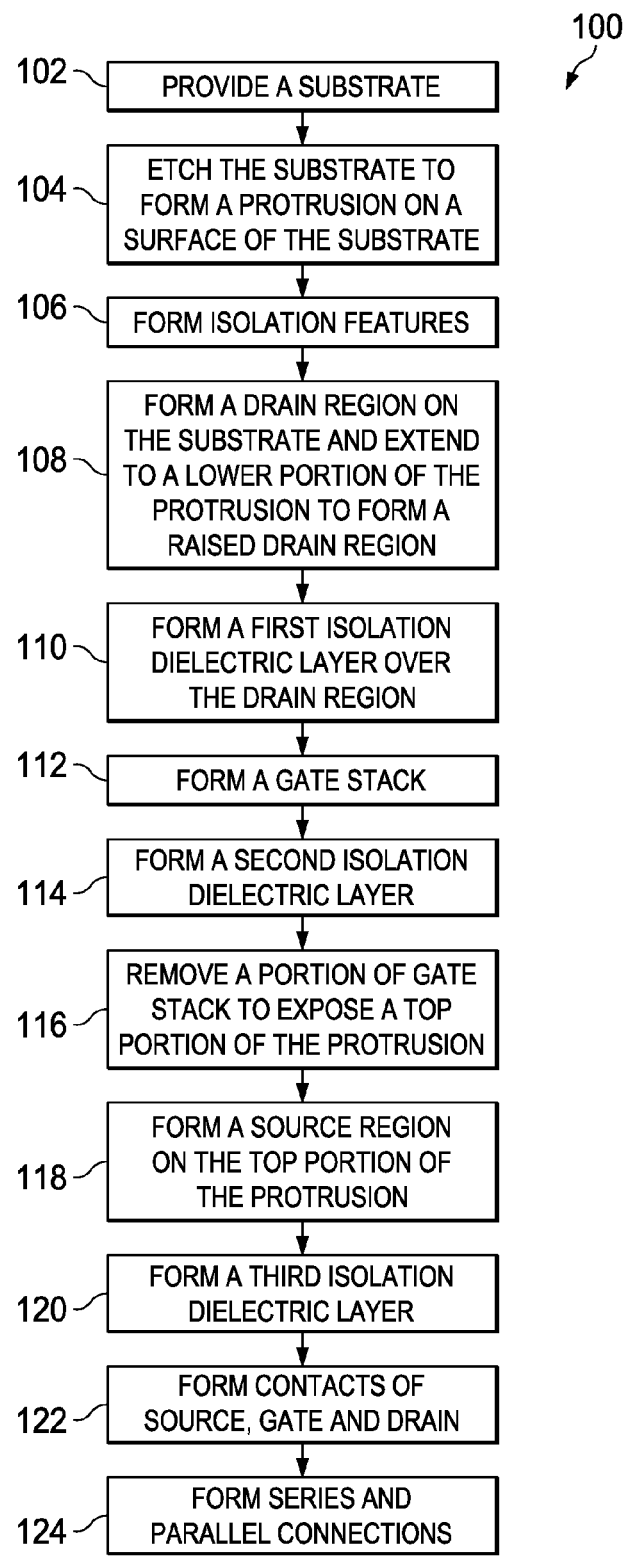
FIG. 1 is a flowchart of an example method for fabricating a semiconductor device constructed according to various aspects of the present disclosure.

FIG. 1 is a flowchart of one embodiment of a method 100 of fabricating one or more TFET devices according to aspects of the present disclosure. The method 100 is discussed in detail below, with reference to a TFET device 200 shown in FIGS. 2 to 13B for the sake of example.

Figure 2:
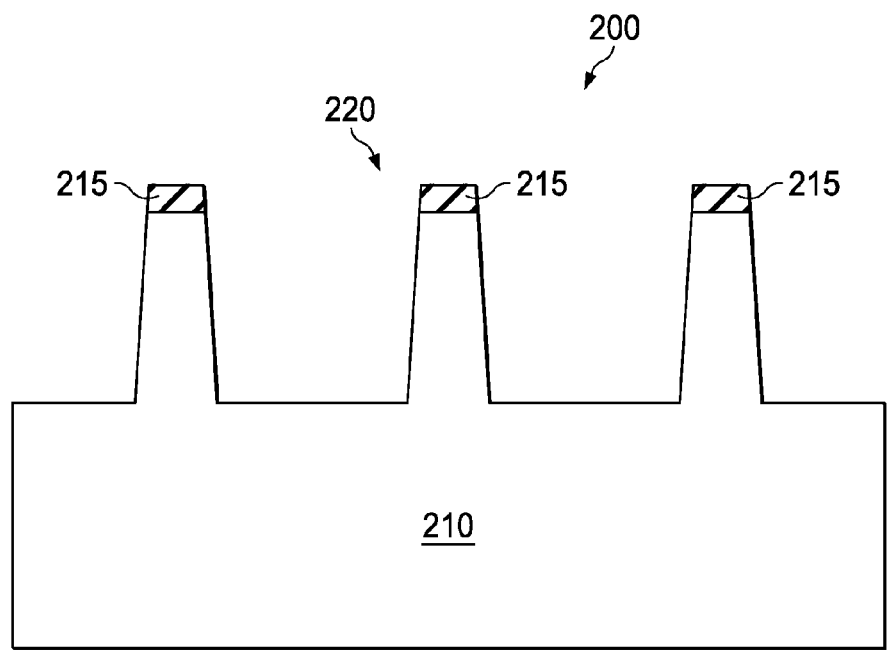

Referring to FIGS. 1 and 2, the method 100 begins at step 102 by providing a substrate 210. The substrate 210 includes silicon. In alternative embodiments, the substrate 210 may include germanium, silicon germanium, gallium arsenide, silicon carbide, indium arsenide, indium phosphide, gallium arsenic phosphide, gallium indium, or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials. The substrate 210 may also include various p-type doped regions and/or n-type doped regions, implemented by a process such as ion implantation and/or diffusion. Those doped regions include n-well and p-well.

The method 100 proceeds to step 104 by etching the substrate 210 to form a frustoconical protrusion structure 220, which protrudes out of the plane of substrate 210. The frustoconical protrusion structure 220 is referred as a core structure 220. The core structure 220 may be formed by lithography and etching processes. In one embodiment, a hard mask layer 215 is deposited on the substrate 210 first. The hard mask 215 includes silicon oxide, silicon nitride, silicon oxynitride, or any other suitable dielectric material. The hard mask 215 may be patterned by lithography and etching processes to define the core structure 220. The substrate 210 is etched by using the patterned hard mask 215 as an etching mask to form the core structure 220. The etch process may include wet etch, dry etch, or a combination thereof. The core structure 220 can be formed with sidewalls having an angle with the planar surface of the substrate 210 ranging from approximately 45 degrees to around 90 degrees.

In one embodiment, the core structure 220 is formed as a cylinder shape. Alternatively, the core structure 220 is formed as square-column, oval cylinder, rectangular column, hexagonal column, or other polygon-column shape.

Figure 3A:
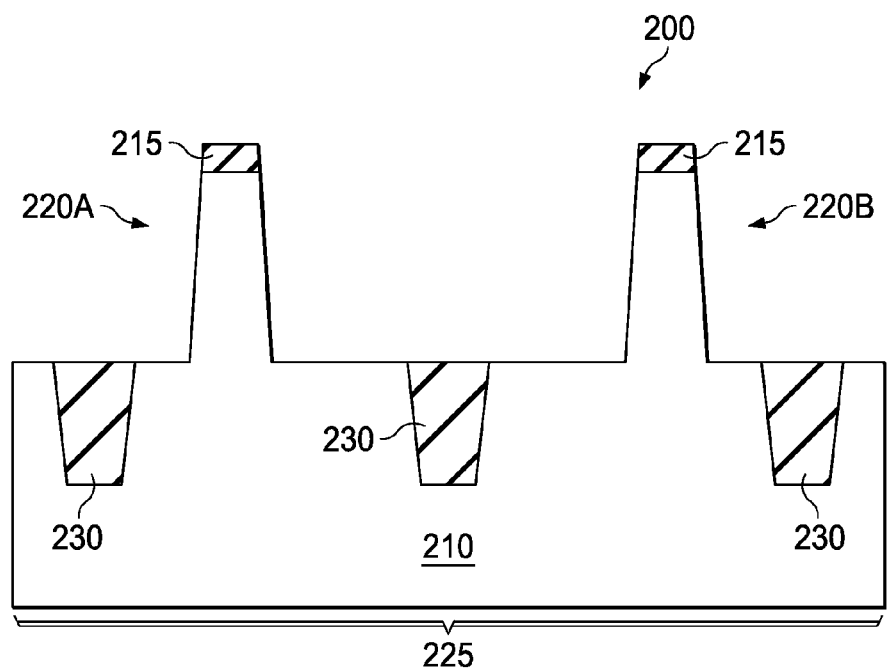
Figure 3B:
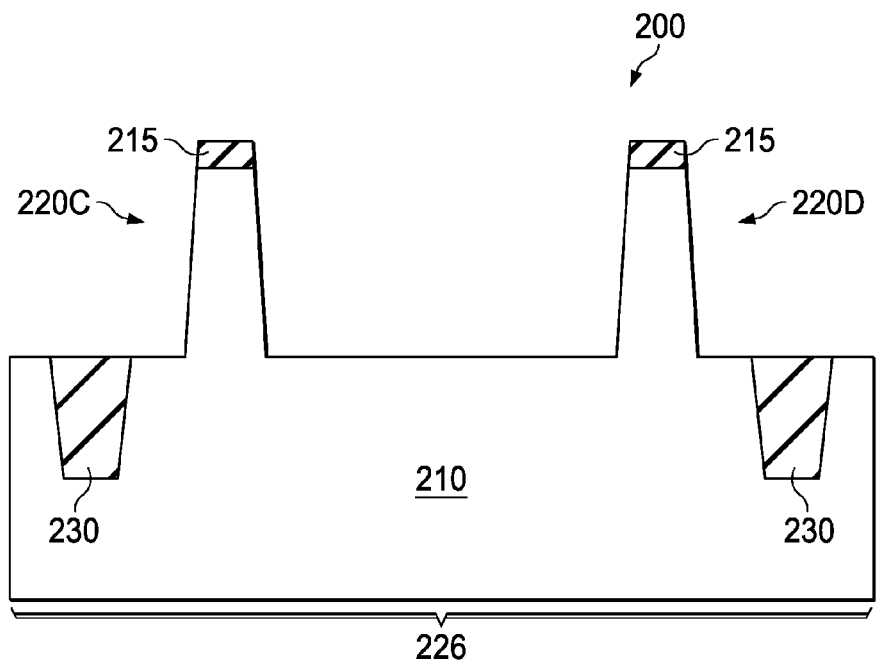

Referring to FIGS. 1 and 3A-3B, the method 100 proceeds to step 106 by forming isolation features 230 on the substrate 210, including a first area 225 and second area 226. In the first area 225, each core structure 220, as an example, core structure 220A and core structure 220B, is isolated by the isolation feature 230. Alternatively, the first area 225 may have one core structure, or more than two core structures. Meanwhile, in the second area 226, there are two or more core structures 220, referred as to 220C and 220D between adjacent isolation features 230. The isolation features 230 may include similar or different structures formed by using different processing technologies. In one embodiment, the isolation features 230 are shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench.

Figure 4A:
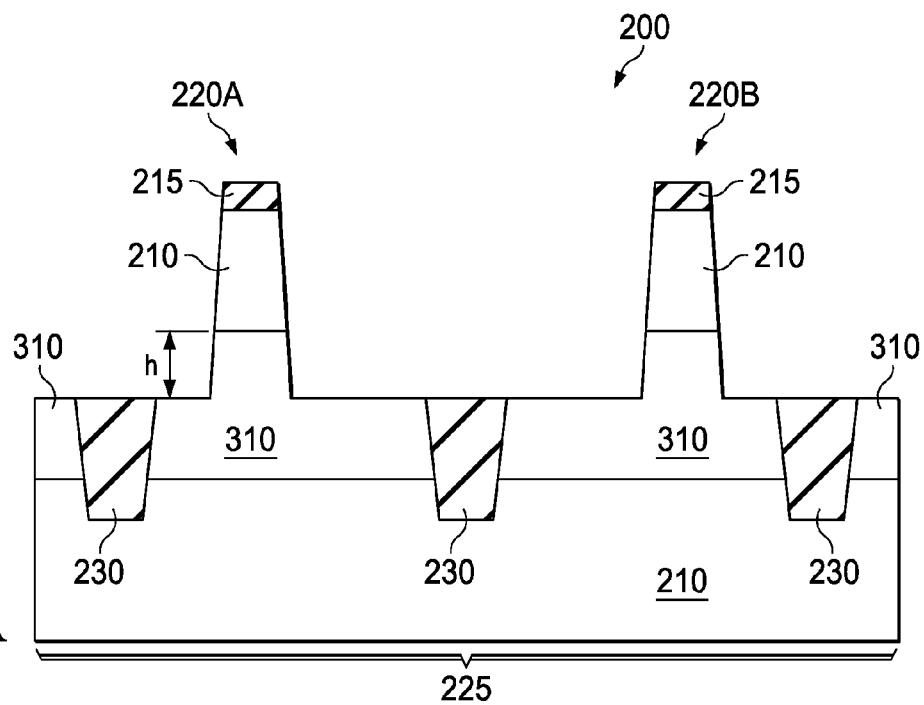
Figure 4B:
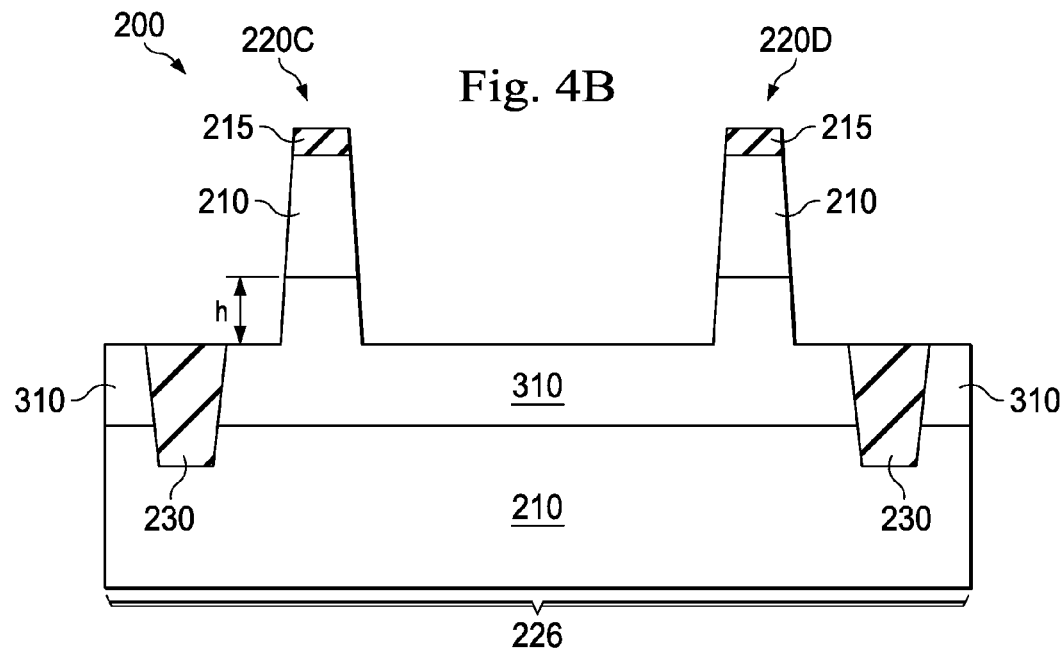

Referring to FIGS. 1 and 4A-4B, the method 100 proceeds to step 108 by forming a drain region 310 on the substrate 210. The drain region 310 is formed by doping a predetermined top portion of the substrate 210 by a suitable technique, such as implantation with a patterned photo resist as an implantation mask. In the present embodiment, the drain region 310 is adjacent to the core structure 220 and between the isolation features 230 in both of the first and second areas, 225 and 226. In the first area 225, the drain region 310 associated with the core structure 220A is isolated to the drain region 310 associated with the core structure 220B by the isolation feature 230. Meantime, in the second area 226, the drain region 310 is a common drain region and shared by all core structures, 220C and 220D, between two adjacent isolation features 310. For a p-type TFET, the drain region 310 may be doped with p-type dopants, such as boron or $BF_2$. For an n-type TFET, the drain region 310 may be doped with n-type dopants, such as phosphorus, arsenic, or combinations thereof. After the implantation, one or more annealing processes may be performed for dopant activation. The annealing processes may include rapid thermal anneal (RTA), laser anneal, or other suitable annealing process. As an example, high-temperature anneal includes a "spike" annealing process that has a very short time duration. During the formation, the dopant is diffused up to a bottom portion of the core structure 220 with a height h, referred as to a raised drain region 310.

Figure 5A:
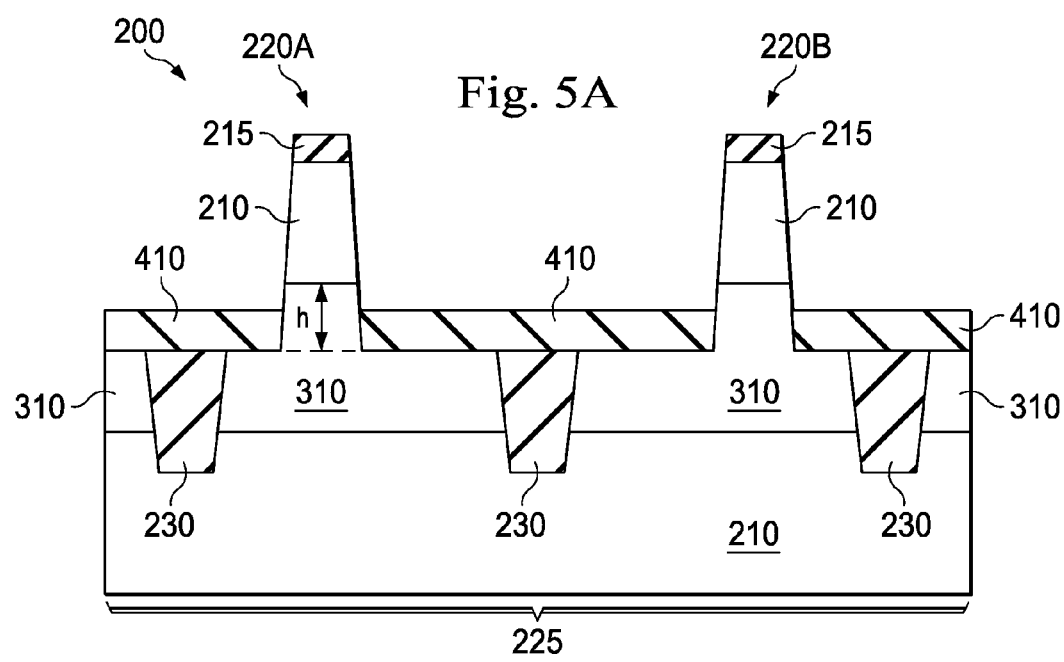
Figure 5B:
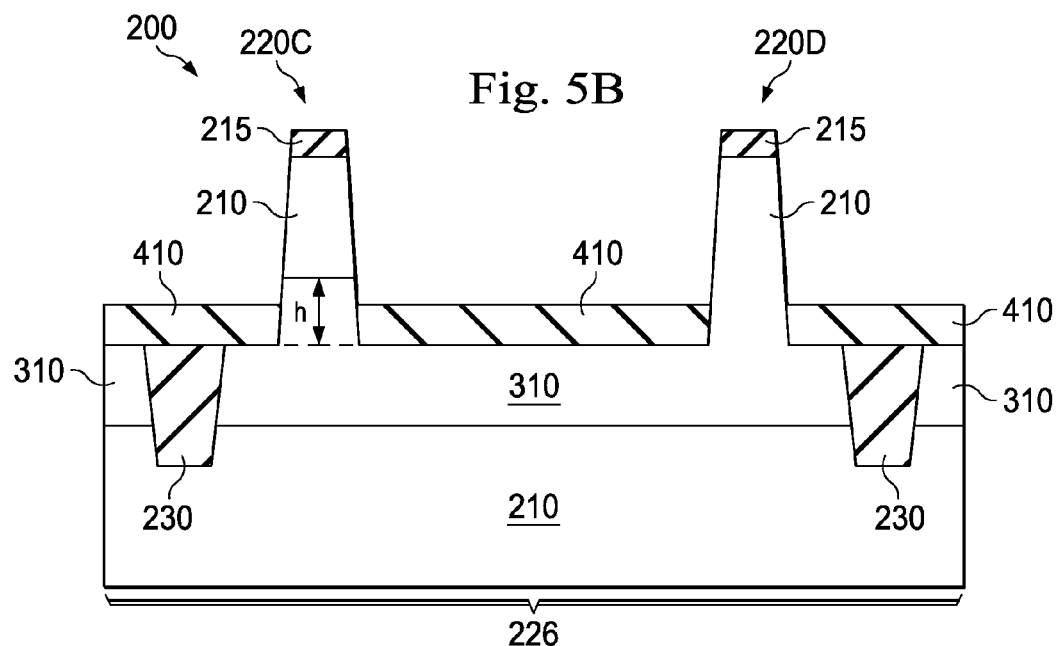

Referring to FIGS. 1 and 5A-5B, the method 100 proceeds to step 110 by forming a first isolation dielectric layer 410 over the drain region 310 by deposition and recess processes. The first isolation dielectric layer 410 includes silicon oxide, silicon nitride, silicon carbide, oxynitride or other suitable materials. The first isolation dielectric layer 410 may include a single layer or multiple layers. The first isolation dielectric layer 410 is deposited by a suitable technique, such as chemical vapor deposition (CVD), atomic layer deposition (ALD), physical vapor deposition (PVD), thermal oxidation, or combinations thereof. In the present embodiment, the isolation dielectric layer 410 is etched back to a thickness such that is substantial less than the height h of the raised drain region 310. The first isolation dielectric layer 410 may be recessed by a selective dry etch, a selective wet etch, or a combination thereof.

Figure 6A:
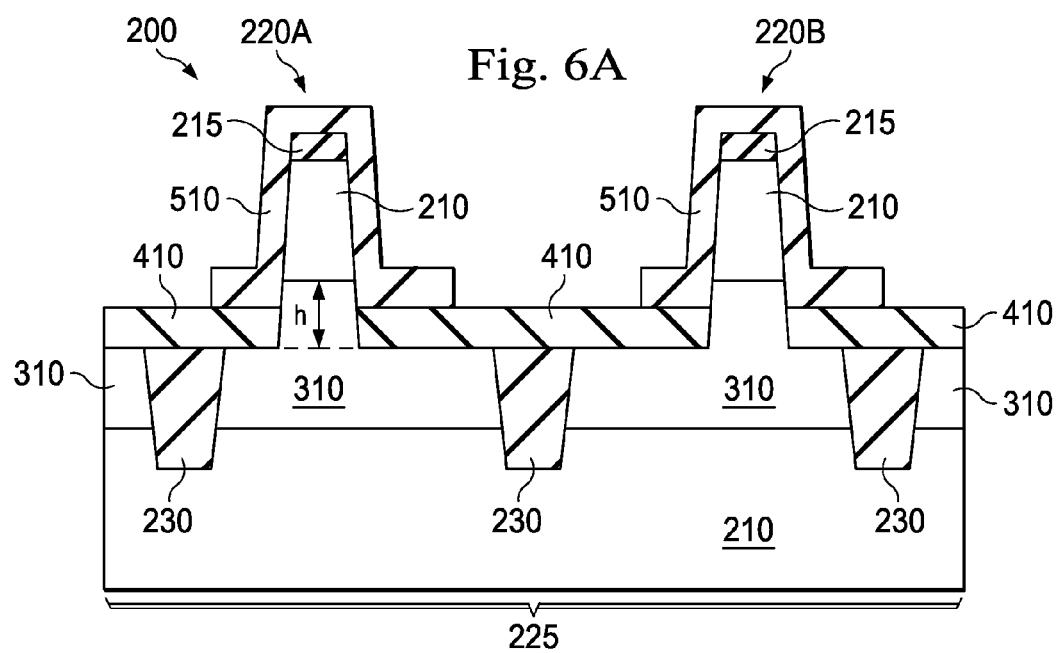
Figure 6B:
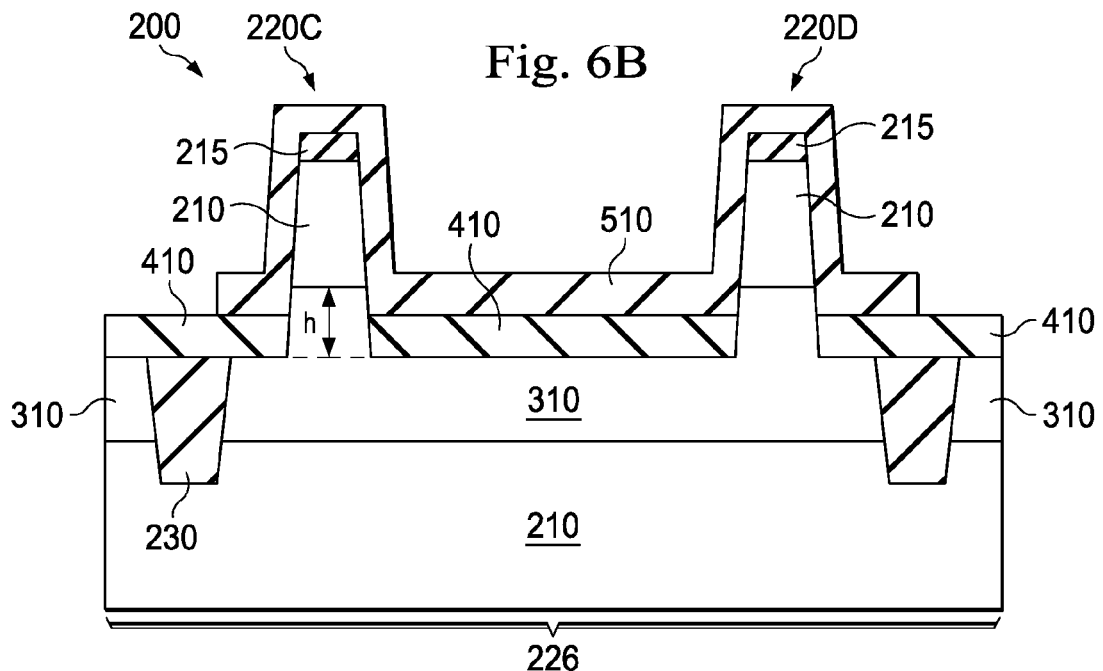

Referring to FIGS. 1 and 6A to 6B, the method 100 proceeds to step 112 by forming a gate stack 510. The gate stack 510 includes a planar portion, which is parallel to the surface of substrate 210 and over the first isolation dielectric layer 410, and a gating surface, which wraps around a middle portion of the core structure 220. The planar portion may be asymmetric to the core structure 220. In one embodiment, the out-of-plane gating surface of gate stack 510 overlaps a portion of the raised drain region 310. In the first area 225, the gate stack 510 associated with the core structure 220A is separated from the gate stack 510 associated with the core structure 220B. Meantime, in the second area 226, the gate stack 510 associated with the core structures, 220C and 220D, is formed to be connected to each other.

The gate stack 510 is formed by any suitable process or processes. For example, the gate stack 510 is formed by a procedure including depositing, photolithography patterning, and etching processes. The deposition processes include CVD, PVD, ALD, metalorganic CVD (MOCVD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching process includes a dry etch, a wet etch, or a combination of dry etch and wet etch.

In one embodiment, the gate stack 510 is a high-k (HK)/metal gate (MG). The HK/MG includes a gate dielectric layer and a MG. The gate dielectric layer may include an interfacial layer (IL) and a high-k (HK) dielectric layer. The IL includes oxide, HfSiO and oxynitride. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials.

In another embodiment, the gate stack 510 is a polysilicon gate stack. The polysilicon gate stack may include a gate dielectric layer and a polysilicon layer deposited over the gate dielectric layer. The gate dielectric layer includes silicon oxide, silicon nitride, or any other suitable materials.

Figure 7A:
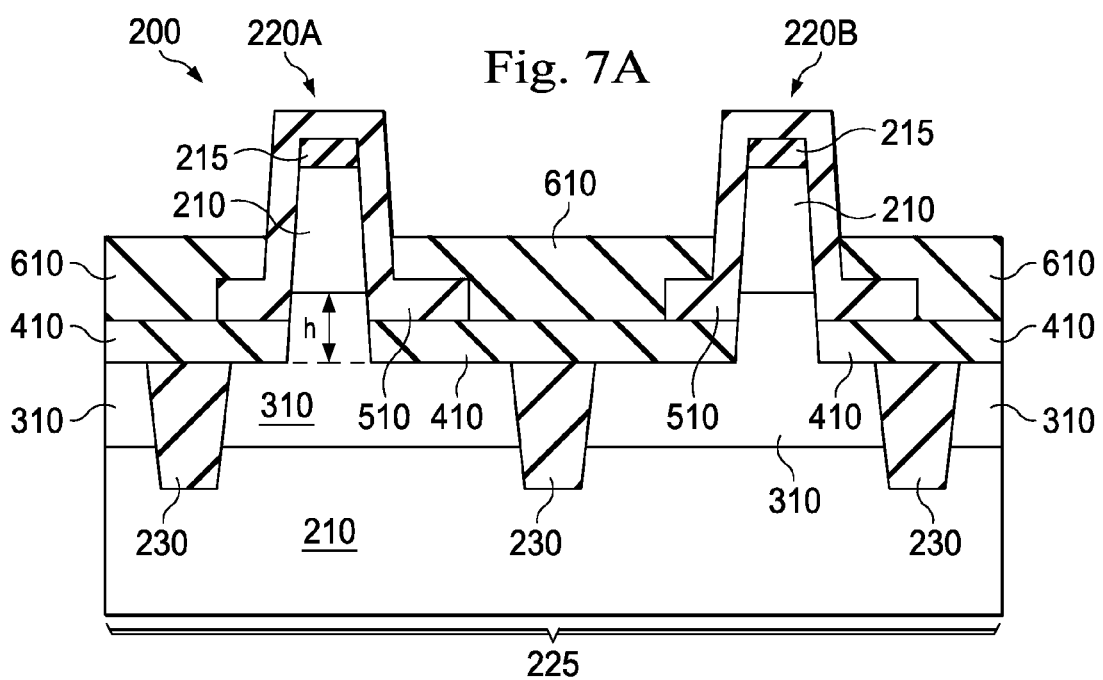

Referring to FIGS. 1 and 7A to 7B, the method 100 proceeds to step 114 by forming a second isolation dielectric layer 610 over the first isolation dielectric layer 410, including over the planar portion of the gate stack 510. The second isolation dielectric layer 610 is similar in many respects to those discussed above in association with the first isolation dielectric layer 410 in FIGS. 5A and 5B. The second isolation dielectric layer 610 is etched back to expose a predetermined height of a top portion of the gating surface of gate stack 510. In one embodiment, the predetermined height is substantially larger than a thickness of the hard mask layer 215.

Referring to FIGS. 1 and 8A-8B, the method 100 proceeds to step 116 by removing a top portion of the gating surface of the gate stack 510 to expose a top portion of the core structure 220 (220A-220D). The top portion of the gating surface of the gate stack 510 may be removed by a selective dry etch, a selective wet etch, a combination thereof, or other suitable processes. The hard mask layer 215 is also removed at the same etch process or at an extra etch process.

Referring to FIGS. 1 and 9A-9B, the method 100 proceeds to step 118 by forming a source region 710 in the top portion of the core structure 220 (220A-220D). In one embodiment, the source region 710 is formed by photolithography patterning and implantation, which is similar in many respects to those discussed above in association with the drain region 310 in FIG. 4. The source region 710 has a different dope type than the drain region 310. In another embodiment, the core structure 220, (220A-220D), is recessed first and then the source region 710 is formed as the top portion of the recessed core structure 220, (220A-220D) by photolithography patterning and implantation. In yet another embodiment, a semiconductor material is epitaxially grown on the recessed core structure 220, (220A-220D). The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The S/D features may be formed by one or more epitaxy or epitaxial (epi) processes. The source region 710 may be in-situ doped during the epitaxy process. In one embodiment, the source region 710 is not in-situ doped, an implantation process (i.e., a junction implant process) is performed to dope the source region 710.

Each drain region 310, gate stack 510 and source region 710 associating with the respective core structure 220 form TFET 200 device units, 200A-200D, as shown in FIGS. 9A-9B.

Referring to FIGS. 1 and 10A-10B, the method 100 proceeds to step 120 by depositing a third isolation dielectric layer 810 over the second isolation dielectric layer 610, including over the source region 710. The third isolation dielectric layer 810 is similar in many respects to those discussed above in association with the first isolation dielectric layer 410 in FIG. 3. Additionally, a CMP process is performed to planarize the top surface of the third isolation dielectric layer 810.

Referring to FIGS. 1 and 11A-11B, the method 100 proceeds to step 122 by forming source contacts 910, gate contacts 920 and drain contacts 930. In one embodiment, the gate contact 920 is formed at the planar portion of one of the gate stack 510. Contacts of 910, 920 and 930 may be formed by lithography patterning and etch processes. The etching process includes a dry etch, a wet etch, or a combination of dry etch and wet etch. The dry etching process may implement fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. The etching process may include a multiple-step etching to gain etch selectivity, flexibility and desired etch profile. In the present embodiment, the contact etch is configured to have an adequate selectivity with respect to source region 710, the gate stack 510 and the drain region 310.

Figure 12:
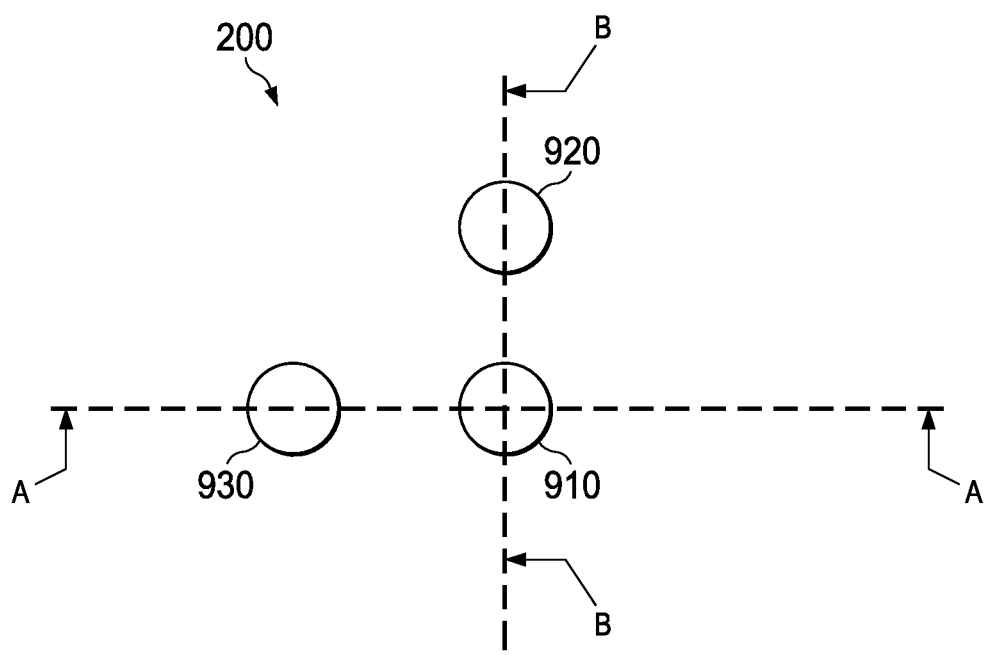
FIG. 12 depicts a top, schematic view of contacts layout of a semiconductor device at fabrication stages constructed according to the method of FIG. 1.

Referring to FIG. 12, in one embodiment, the contacts of TFET 200 are arranged such that source contacts 910 and drain contacts 930 are arranged co-linearly along a reference line A-A, the gate contact 920 is arranged along a reference line B-B, which is perpendicular to the reference line A-A. Embodiments similar to but different from TFET 200 are within the scope of this disclosure. For instance, an angle that can be visualized by the arrangement of source contact 910 and drain contact 930 at the vertex, and gate contact 920 can be any angle. This may allow a circuit designer added flexibility when laying out a circuit design as the TFETs themselves can be angled as needed. Additionally, embodiments such as TFET 200, and others may be rotated to a desired orientation.

Referring to FIGS. 1 and 13A-13B, the method 100 proceeds to step 124 by forming a series connection in the first area 225 and a parallel connection in the second area 226. Connections are accomplished by conductive lines 950 (including filling in contacts). In one embodiment, the contacts of TFET 200 are arranged such that source contact 910 and drain contact 930 are arranged co-linearly along a reference line A-A, the gate contact 920 lays on reference line B-B, which is perpendicular to the reference line A-A. In the first area 225, the series connection is formed between TFET device unit 200A and 200B by using conductive lines 950 (through respective contacts) to connect the source region 710 of the TFET device unit 200A to the drain region 310 of the TFET device unit 200B and connect gate stacks 510 of TFET device unit 200A and 200B together. Meantime, in the second area 226, the parallel connection is formed by using conductive lines 950 (through respective contacts) to connect source regions 710 of TFET device unit 200C and 200D together while gate stacks 510 of TFET device unit 200C and 200D connecting together. The conductive line 950 may be formed by aluminum (Al), copper (Cu) or tungsten (W). The conductive line 950 may be formed by processes of deposition, lithography and etch known in the art.

Additional steps can be provided before, during, and after the method 100, and some of the steps described can be replaced, eliminated, or moved around for additional embodiments of the method 100.

Based on the above, the present disclosure offers a TFET device employing a series connection and parallel connection among each TFET device unit. By utilizing these two type connections, a target gate height and width are achieved with not only design flexibility but also manufacturing simplicity. The method is quite feasible to an existing TFET fabrication.

The present disclosure provides many different embodiments of TFET device that provide one or more improvements over other existing approaches. In one embodiment, the TFET device includes a substrate having a first area and a second area, a plurality of frustoconical protrusion structures disposed over the substrate, an isolation feature disposed on the substrate. In the first area, each frustoconical protrusion structure is isolated to each other by the isolation feature. In second area there are more than one frustoconical protrusion structures between adjacent isolation features. The TFET device also includes a drain region disposed over in the first area, where the drain region associating with the respective frustoconical protrusion structures is separated to the drain region associated with the adjacent frustoconical protrusion structures by the isolation feature, and in the second area where the drain regions associating with respective frustoconical protrusion structures are connected to each other. The TFET device also includes a gate stack disposed over the first area, where the gate stack associating with the respective frustoconical protrusion structure is separated to the gate stack associating with the adjacent frustoconical protrusion structure, and over the second area, where the gate associating with frustoconical protrusion structures are connected to each other. The TFET device also includes a source region disposed as a top portion of the frustoconical protrusion structure and a conductive line making a series connection in the first area and a parallel connection in the second area.

In another embodiment, a vertical TFET device includes a semiconductor substrate, a plurality of frustoconical protrusion cylinders disposed in the first area and second areas, protruding out of the plane of semiconductor substrate, a plurality of isolation features disposed over the first and second areas. In the first area, each frustoconical protrusion cylinder is isolated to each other, and in the second area, there are more than one frustoconical protrusion cylinders between adjacent isolation features. The vertical TFET device also includes a source region as a top portion of the frustoconical protrusion cylinder, a high-k/metal gate (HK/MG) disposed over the semiconductor substrate. The HK/MG has a planar portion, which is parallel to the surface of semiconductor substrate and a gating surface, which wraps around a middle portion of the frustoconical protrusion cylinder, including overlapping with the source region. Gate stacks are arranged such that in the first area, gate stacks associating with the respective frustoconical protrusion cylinder is separated to each other and in the second area, gate stacks associating with the respective frustoconical protrusion cylinder are connected to each other. The vertical TFET device also includes a drain region disposed over the semiconductor substrate adjacent to the frustoconical protrusion cylinder and extending to a bottom portion of the frustoconical protrusion cylinder as a raised drain region. Drain regions are arranged such that in the first area, drain regions associated with respective frustoconical protrusion cylinder are separated by the isolation features, and in the second area, drain regions associated with respective frustoconical protrusion cylinder are connected to each other. The vertical TFET device also includes an isolation dielectric layer disposed over the source region, the gate stack and the drain region, including between the planar portion of the HK/MG and the drain region and a conductive line making a series connection in the first area and a parallel connection in the second area. Connections are arranged in such way that in the first area, the source region connects to a neighbor drain region and gate stacks connects together, and in the second area, all source regions are connected together and all gate stacks are connected together.

In yet another embodiment, a method of fabricating a semiconductor device includes providing a substrate, providing a substrate, etching the substrate to form a protrusion on a surface of the substrate, forming isolation feature on the substrate in a first area and a second area. In the first area each protrusion is isolated by the isolation feature and in the second area, there are more than one protrusions between adjacent isolation features. The method also includes doping a portion of the substrate adjacent to the protrusion to form a drain region between isolation features, including extending to a lower portion of the protrusion to form a raised drain region. The method also includes forming a first isolation dielectric layer over the drain region and forming gate stack having a planar portion over the drain region, which is parallel to the surface of substrate, and a gating surface, which wraps around a middle portion of the protrusion, including overlapping with the raised drain region. In the first area each gate stack is isolated to each other and in the second area gate stacks are connected to each other. The method also includes forming a second isolation dielectric layer over the planar portion of the gate stack and the drain region, recessing a portion of the gating surface of the gate stack to expose a top portion of the protrusion, forming a source region on the top portion of the protrusion with a different dope type than the drain region, including overlapping with the gating surface of the gate stack, forming a third isolation dielectric layer over the source region, the gate stack and the second isolation dielectric layer, forming a source contact, a gate contact and a drain contact and by utilizing a conductive line (including through contacts of source, gate and drain) forming a series connection in the first area and a parallel connection in the second area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, source and drain regions are often swapped with an appropriate process modification/interchanging, depending on the transistor's eventual use and electrical configuration. Therefore, the terms "source" and "drain" are deemed to be interchangeable under such circumstances. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a field effect transistor (FET), the method comprising:
    providing a substrate;
    etching the substrate to form a protrusion on a surface of the substrate;
    forming isolation feature on the substrate in a first area and a second area, wherein in the first area each protrusion is isolated by the isolation feature, wherein in the second area, there are more than one protrusions between adjacent isolation features;
    doping a portion of the substrate adjacent to the protrusion to form a drain region between isolation features, including extending to a lower portion of the protrusion to form a raised drain region;
    forming a first isolation dielectric layer over the drain region;
    forming gate stack having a planar portion over the drain region, which is parallel to the surface of substrate, and a gating surface, which wraps around a middle portion of the protrusion, including overlapping with the raised drain region, wherein in the first area each gate stack is isolated to each other, wherein in the second area gate stacks are connected to each other;
    forming a second isolation dielectric layer over the planar portion of the gate stack and the drain region;
    recessing a portion of the gating surface of the gate stack to expose a top portion of the protrusion;
    forming a source region on the top portion of the protrusion with a different dope type than the drain region, including overlapping with the gating surface of the gate stack;
    forming a third isolation dielectric layer over the source region, the gate stack and the second isolation dielectric layer;
    forming a source contact, a gate contact and a drain contact; and
    by utilizing a conductive line (including through contacts of source, gate and drain) forming a series connection in the first area and a parallel connection in the second area.

2. The method of claim 1, wherein the series connection in the first area is formed such that connecting the source region associating with the protrusion to the drain region associating with an adjacent protrusion, and connecting gate stacks associated with each protrusion together.

3. The method of claim 1, wherein the series connection in the second area is formed such that connection source regions associating with each protrusion together.

4. A method for forming a field effect transistor (FET), the method comprising:
    providing a substrate with first and second areas, each are including at least a plurality of protrusions and a plurality of isolation features, wherein in the first area each protrusion is isolated by the isolation feature, wherein in the second area, there are at least two protrusions between adjacent isolation features;

forming a drain region and first isolation dielectric layer over the drain region in each area;

forming gate stack having a planar portion over the drain region and a gating surface which wraps around a middle portion of each protrusion, including overlapping with the drain region;

forming a second isolation dielectric layer over the planar portion of the gate stacks and the drain regions;

forming a source region on a top portion of the protrusions in each area;

forming a third isolation dielectric layer over the source region, the gate stack and the second isolation dielectric layer.

5. The method of claim 4, further comprising:

forming a series connection in the first area and a parallel connection in the second area.

6. The method of claim 5, wherein the series connection in the first area is formed such that connecting the source region associating with the protrusion to the drain region associating with an adjacent protrusion, and connecting gate stacks associated with each protrusion together.

7. The method of claim 5, wherein the series connection in the second area is formed such that connection source regions associating with each protrusion together.

8. The method of claim 5, wherein the gate stack includes a polysilicon layer.

9. The method of claim 5, wherein the gate stack includes a metal material.

10. A method of making a semiconductor device comprising:

receiving a semiconductor substrate having a first and a second areas;

forming a plurality of frustoconical protrusion cylinders disposed in the first area and second areas, protruding out of the plane of semiconductor substrate;

disposing a plurality of isolation features over the first and second areas, wherein in the first area, each frustoconical protrusion cylinder is isolated to each other, wherein in the second area, there are more than one frustoconical protrusion cylinders between adjacent isolation features;

forming a source region as a top portion of the frustoconical protrusion cylinder;

forming a gate stack over the semiconductor substrate, wherein the gate stack has a planar portion, which is parallel to the surface of semiconductor substrate and a gating surface, which wraps around a middle portion of the frustoconical protrusion cylinder, including overlapping with the source region, wherein gate stacks are arranged such that:

in the first area, gate stacks associating with the respective frustoconical protrusion cylinder is separated to each other; and in the second area, gate stacks associating with the respective frustoconical protrusion cylinder are connected to each other;

forming a drain region disposed over the semiconductor substrate adjacent to the frustoconical protrusion cylinder and extending to a bottom portion of the frustoconical protrusion cylinder as a raised drain region, wherein drain regions are arranged such that:

in the first area, drain regions associated with respective frustoconical protrusion cylinder are separated by the isolation features; and in the second area, drain regions associated with respective frustoconical protrusion cylinder are connected to each other;

depositing an isolation dielectric layer over the source region, the gate stack and the drain region, including between the planar portion of the gate stack and the drain region; and forming a conductive line making a series connection in the first area and a parallel connection in the second area, wherein connections are arranged in such way:

in the first area, the source region connects to a neighbor drain region and gate stacks connects together; and in the second area, all source regions are connected together and all gate stacks are connected together.

11. The method of claim 10, further comprising:

forming a source contact disposed over the source region and a drain contact disposed over the drain region, wherein the source and drain contacts are arranged co-linearly along a first line; and forming a gate contact disposed over the planar portion of the gate stack, wherein the gate contact is arranged along a second line, which is perpendicular to the first line.

12. The method of claim 10, wherein the gate stack includes a polysilicon layer.

13. The method of claim 10, wherein the gate stack includes a metal material.

14. The method of claim 13, wherein the gate stack is a high-k/metal gate.

15. The method of claim 10, wherein the series and parallel connections are configured by the conductive line through respective contacts of the source, the gate and the drain.

16. The method of claim 15, wherein the source and drain contacts are arranged co-linearly along a first line.

17. The method of claim 15, wherein the gate contact is arrange along a second line, which is perpendicular to the first line.

18. The method of claim 10, wherein the drain region is adjacent to the protrusion structure and extending to a bottom portion of the protrusion structure as a raised drain region.

19. The method of claim 10, wherein the gate stack has a planar portion, which is parallel to the surface of substrate and a gating surface, which wraps around a middle portion of the protrusion structure, including overlapping with the raised drain region.

20. The method of claim 19, wherein the gate contact is disposed on the planar portion of the gate stack.

* * * * *